United States Patent [19]  
Schintlmeister

[11] 4,162,338  
[45] Jul. 24, 1979

[54] COATED CEMENTED CARBIDE ELEMENTS AND THEIR MANUFACTURE

[75] Inventor: Wilfried Schintlmeister, Reutte, Austria

[73] Assignee: Schwarzkopf Development Corporation, New York, N.Y.

[21] Appl. No.: 875,071

[22] Filed: Feb. 3, 1978

Related U.S. Application Data

[60] Division of Ser. No. 571,695, Apr. 25, 1975, Pat. No. 4,101,703, which is a continuation of Ser. No. 329,128, Feb. 2, 1973, abandoned.

[30] Foreign Application Priority Data

Feb. 4, 1972 [AT] Austria ................................ 896/72
Jul. 21, 1972 [AT] Austria .............................. 6317/72

[51] Int. Cl.$^2$ .................. B05D 1/36; B05D 3/10; B05D 7/14
[52] U.S. Cl. .................................. 427/249; 148/6.3; 427/248 A; 427/248 B; 427/248 C; 427/248 E; 427/248 J
[58] Field of Search ........... 427/248 A, 248 B, 248 C, 427/248 J, 249, 248 E; 148/63

[56] References Cited

U.S. PATENT DOCUMENTS

| | | | |
|---|---|---|---|
| 3,642,522 | 2/1972 | Gass et al. | 427/249 |
| 3,656,995 | 4/1972 | Reedy | 427/249 X |
| 3,684,585 | 8/1972 | Stroup et al. | 427/249 X |
| 3,771,976 | 11/1973 | Wakefield | 427/249 X |

*Primary Examiner*—James R. Hoffman
*Attorney, Agent, or Firm*—Morgan, Finnegan, Pine, Foley & Lee

[57] ABSTRACT

Cemented carbide elements with working faces bearing a thin multilayer or stratified coating of nonuniform composition of wear-resistant materials exhibit superior wear-resistance for improved performance and service life under severe service conditions as in the case of inserts for cutting tools and wire drawing dies. In one embodiment, an initial carbon-rich layer of titanium carbide or carbonitride coating material in direct contact with a cemented carbide part or insert underlies a middle or intermediate stratified transition zone made up of a series of parallel layers or strata of coating material wherein the content of carbon and nitrogen is not constant but varies with the stratum or location by depth in that zone with the material gradually changing to titanium compounds that are progressively lower in combined carbon content and richer in nitrogen than in the initial layer until the composition of the outermost stratum of the transition zone approximates that of the overlying surface layer of high nitrogen content (e.g., titanium nitride). The coating is formed by a gas deposition method wherein changes in the concentration of gaseous carbon and nitrogen compounds are used to control the formation of the various layers of different composition in the layered coating.

24 Claims, No Drawings

COATED CEMENTED CARBIDE ELEMENTS AND THEIR MANUFACTURE

This is a divisional of application Ser. No. 571,695 filed Apr. 25, 1975 (now U.S. Pat. No. 4,101,703), which is a continuation of application Ser. No. 329,128 filed Feb. 2, 1973, now abandoned.

BACKGROUND OF THE INVENTION

1. Field of the Invention

This invention is concerned with protective coatings for wear-resistant elements intended for severe operating conditions and with methods of depositing such coatings on the wear-resistant substrates or inserts.

2. Prior Art

Cemented carbides, also known as sintered carbides, are solid and coherent masses made by pressing and sintering a mixture of powders of one or more metallic carbides and a much smaller amount of an iron group metal, such as cobalt, to serve as a binder metal. These carbides may be used as tools or inserts for machining, milling, blanking, and drawings operations; also as shaping dies, spinning dies, and for many other applications. Such tools are capable of performance beyond the limits of high speed steels and in many cases are suitable for use on very hard abrasive materials and on tough alloys. Cemented carbides are widely used for structural parts and tools subject to intense wear or other service loads that require high compressive strength. Suitable carbides for such purposes include the carbides of tungsten, titanium, tantalum, columbium, molybdenum, vanadium, chromium, zirconium, and hafnium.

Cemented carbides because of their unique strength and hardness are frequently subjected to conditions of intense wear. The manner and rate of wear depends very largely on the use and service conditions of the cemented carbide part. Wear is frequently caused by mechanical abrasion which can be greatly intensified by diffusion processes when operating at elevated temperatures. Corrosion is also a cause in the wear of such parts, for example, when cemented carbide is used in corrosive media or when oxidation in the air takes place at elevated temperatures. When cemented carbides are used for shaping of other parts, either by machining and nonchipping shaping operations or by other processes, the cemented carbide parts are not only subjected to heavy mechanical stresses but there is frequently also intense heating which greatly accelerates the wear.

In the machining of long-chipping and short-chipping materials, as for example, steel or cast iron, respectively, wear on the cutting edge can occur as a result of cratering of the rake face and abrasion of the clearance face. Furthermore, the chips can adhere or weld onto the cutting edge of the part and cause chipping or splintering of the edge. In interrupted cuts, crack formation may be caused by rapid temperature changes and splintering can occur from heavy impacts.

It has now been discovered that wear-resistant stratified coatings composed of a number of layers of certain different compositions provide a number of significantly improved results of an unpredictable nature as described hereinafter, particularly when these coatings are employed as protective wear-resistant coatings on cemented carbide substrates and other hard material bases. The coated articles have many uses for metal working and other purposes that involve exposure to mechanical wear and abrasion.

SUMMARY OF THE INVENTION

The present invention relates to a hard water-resistant multilayer coating of nonuniform composition in adjoining layers and wherein said coating contains at least two different wear resistant materials and includes at least two elements of the group consisting of carbon, nitrogen, boron and silicon in chemical combinations with titanium. It also encompasses articles with such coatings on hard material bases or substrates of the type described hereinafter, and especially cemented carbides substrates having an adherent coating that contains at least two different wear-resistant materials and includes carbon and nitrogen in chemical combination with titanium.

This invention also encompasses a method of making the aforesaid articles by deposition onto substrates from reactive gaseous mixtures under controlled reaction conditions, including the composition of the gaseous mixtures.

Other aspects of the invention involve one or more of such features as the structure of the multilayer (i.e., more than one layer) article and the thickness and disposition or location of its layers, especially carbon-rich layers composed of material of a substantial or high carbon content and a lower nitrogen content, as well as nitrogen-rich layers of material containing less carbon than nitrogen.

DESCRIPTION OF EMBODIMENTS OF THE INVENTION

The coated articles of the invention may employ as a base or substrate any hard solid material to which the coatings will adhere. These hard materials are generally hard metals or alloys thereof, including metal-like alloys, compositions or materials. Thus, the substrates may be cermets and like products of powder metallurgy, as well as hard metal carbides and/or nitrides, etc. and alloys, such as cobalt-chromium-tungsten superalloys and other alloys employed in high speed cutting tools. In general, sintered materials are preferred as substrates, especially the wear-resistant cemented carbides. Among the many suitable base or substrate materials, cemented tungsten carbide compositions containing about 5–30% of a binder metal of the iron group (cobalt iron, and/or nickel) have been used with excellent results, and up to a total of 40% of the tungsten carbide content may be replaced by one or more other carbides, including those of titanium, tantalum, niobium, vanadium or chromium. Cemented carbides containing from 60–90% titanium carbide with the balance being nickel or a nickel-molybdenum alloy binder are also used and up to half of this titanium carbide may be replaced by titanium nitride.

A coating of the present invention is characterized by a multilayer structure, often so thin that the total thickness of the coating is less than 10 or 20 microns, as well as the fact that its chemical composition is not uniform or homogeneous although its physical appearance is typically homogeneous with no strata visible even under a microscope. These coatings are made up of two or more layers, and at least two of the layers are of different composition in respct to having either different chemical components of different proportions of the same components or elements. The principal constituents of the coatings are metal compounds of at least two nonmetals of the group consisting of carbon, nitrogen, boron and silicon, of which carbon and nitrogen are generally preferred. But also compounds of nonmetals, such as boron carbide, boron nitride and silicon carbide, can be used. Titanium may be utilized as the sole metallic component of such compounds; also it is contemplated that it may be associated with considerable amounts of compounds of one or more other metals in Groups III, IV, V and VI of the Periodic Table of Elements that have atomic numbers in the range of 21 to 74. Thus, one may also employ compounds of one or more of such metals as chromium, molybdenum, tungsten, scandium, yttrium, lanthanum, zirconium, hafnium, vanadium, niobium and tantalum, usually in lesser total amount so that the titanium constitutes a major portion or more that 50 % of the total weight of the chemically combined metals in the coatings. In some cases it may be also useful to substitute more than 50 % of the titanium. If coatings having particularly great ductility are required, then additions of iron, cobalt, or nickel, or molybdenum, or mixtures thereof up to about 20 % of the total coating weight are advantageous. While the specific description hereinafter is directed entirely at coatings composed of titanium compounds and their deposition for the purposes of a full and detailed disclosure of materials that have provided greatly improved results, such description is generally applicable to coatings which also contain the compounds of the aforementioned other metals and nonmetals.

In respect to the contents of nonmetals in the titanium compounds in the coatings of this invention, a nitrogen or carbon content of more than 14% by weight is regarded as a high nitrogen or high carbon content. Amounts of these elements below 6% are considered low contents, and the intermediate range of ;b 6-14% may ba called an average or medium content of carbon or nitrogen. On the other hand, the expressions "carbon-rich" and "nitrogen-rich" herein are intended to denote coating deposits wherein carbon or nitrogen, respectively, constitutes a major proportion of the total weight of combined nonmetals in the particular deposits and also to denot gaseous mixtures containing enough carbon-containing or nitrogen-containing gas material to produce such solid deposits. In general, this means that a solid deposit has a carbon or nitrogen concentration, respectively, that is either a high content or in the upper half of the intermediate content range, say above 10%.

In general, the chemical compositions of each of the various layers or strata are substantially uniform in their planar dimensions, that is across the entire width and length of their areas, by reason of the manner of their deposition from the vapor state onto solid bases or substrates as described hereinafter; instead the desired and significant differences in composition occur through the depth or thickness of the coating, and the composition of one principal layer is different from the adjoining overlying or underlying layer; and this difference in composition may be slight and progressive in gradations through a transition zone having many ultra-thin strata in some instances or a more pronounced change in other cases.

The arrangement, thickness and composition of the individual layers will depend upon the surface conditions of the wear part. For instance, these may consist of several different layers, namely pure titanium carbide, titanium carbonitrides of medium to high carbon content, pure titanium nitride or titanium carbonitrides with a high nitrogen content. In some cases, it may be advantageous to have five or more layers while in other cases, two principal layers may be sufficient, for example, a carbon-rich layer and a nitrogen-rich layer of titanium compounds. The individual layers can be either contiguous or there may be an intermediate stratified transition zone wherein the intermediate layers or strata have variable carbon and nitrogen contents; that is, the combined carbon content is decreasing and the combined nitrogen content increasing in one direction through the thickness of that zone (e.g., away from the substrate and toward the exterior surface of the composite coating), and the carbon is increasing and nitrogen decreasing in the other direction (e.g., toward the substrate). Such changes in composition may be essentially continuous or very gradual in such a transition zone wherein the composition is changed from a composition similar to that of a principal layer on one side of the zone to a composition similar to that of a different principal layer on the other side of the zone. On the other hand, the change in composition may be very marked as at the single interface of two contiguous carbon-rich and nitrogen-rich coating layers.

The thickness of a transtional carbonitride layer or zone may be about 0.1 to 10 microns. The individual or principal layers or titanium nitride and titanium carbonitride having medium to high nitrogen content, are usually present in thicknesses of about 0.3 to 30 microns. The individual or principal layers of titanium carbide and titanium carbonitride having a low nitrogen content are usually present in thicknesses of 0.2 to 20 microns.

In many cases, it has been found advantageous to have a layer structure in which the layer or stratum with the maximum carbon content is located close to the base or substrate surface and remote from the external surface of the coating, whereas the layer or stratum of maximum nitrogen content is located close to the surface of the coating, and remote from the substrate. For example, the layer near the base may consist of titanium carbide or a titanium carbonitride and the layer near the surface of the coating of titanium nitride. The coating can be formed in such manner that a pure titanium carbide layer is joined to a pure titanium nitride layer by means of a series of carbonitride layers in a transition zone that provide a gradual, and continuous change in composition from carbide to nitride.

The formation of the coating layers in accordance with the present invention can be most simply carried out by use of a gas phase deposition.. However, other well known methods such as plasma spraying, sputtering, or pack cementation have also been found useful.

Gas phase deposition has the particular advantage that the layer composition can be readily controlled by regulation of the composition, the pressure and temperature of the gas phase. The composition of the gas can easily be adjusted by addition of suitable gaseous compounds. Furthermore, the mixing ratio of the gas phase may also be varied during the deposition process in a simple manner which causes a corresponding change in the deposited coating composition. The cemented carbide parts may be cleaned by conventional techniques prior to applying the coating material. Surface carburization of the cemented carbide substrates may also be carried out where the carbon content of the cemented carbide is too low for effective coating with the hard materials of this invention.

Atmospheric pressure may be employed for the gas deposition of all the coating materials as in the examples that follow, but it is also contemplated that it may be desirable to employ higher or lower pressures in some instances. For example, it may be advantageous to employ subatmospheric pressures for depositing coatings of titanium carbide, and it is also contemplated that titanium nitride deposits may be formed with a gaseous mixture at superatmospheric pressures. Suitable operating temperatures for the preferred titanium compounds of carbon and nitrogen are in the 700° to 1200° C. range.

The gas mixture is varied depending upon the composition of the layer desired to be deposited. Generally, in order to form a pure titanium nitride layer, the gas mixture comprises a titanium halide, for example, titanium tetrachloride; nitrogen or gaseous nitrogen compounds such as ammonia, and similar nitrogen compounds. The gas mixture may also contain inert gases, or hydrogen, or a mixture thereof.

In order to form titanium carbonitride layers, a gas mixture preferably comprises a titanium halide, a hydrocarbon gas, and nitrogen or a gaseous nitrogen compound, such as, aniline, pyridine, aliphatic and aromatic amines and similar organic nitrogen compounds. The gas mixture may also contain inert gases, or hydrogen, or a mixture thereof.

In order to form a pure titanium carbide layer, the gas mixture may comprise a titanium halide, and hydrocarbon gas. The gas mixture may also contain inert gases, or hydrogen, or a mixture thereof. Other sources of carbon for the process are the vapors of organic halides of either the aliphatic or aromatic type.

According to the present invention, there is provided a new coating for cemented carbide parts which reduces abrasion and cratering of the surfaces of the cemented carbide tool inserts to a surprising and outstanding degree. This is in marked contrast with results that have been obtained with tool inserts bearing a coating of uniform composition. For instance, special cutting disposable inserts and tips made of cemented carbides for machining parts have recently been developed, and these have a wear-resistant surface coating of titanium carbide. Such disposable cutting inserts, e.g., coated with titanium carbide, generally have had two to three times the service life of similar uncoated disposable tips when used under comparable machining conditions. However, their service life is limited by the cratering type of wear although the clearance face wear is relatively slight.

It has been proposed in the U.S. Pat. No. 3,717,496 to coat cemented carbide inserts with titanium nitride or titanium carbonitrides in order to reduce wear. In practice it was found that titanium carbide produces better protection for the clearance face, whereas titanium nitride provides higher resistance to cratering, but the clearance face wear is 2 or 3 times greater than with a comparable insert coated with titanium carbide. Accordingly, in the case of titanium nitride coatings, the great clearance face wear frequently causes failure of the inserts before marked cratering has occured; hence, the improved cratering resistance could not even be utilized.

It has now been discovered that the coatings of the present invention which may consist of different or alternating layers rich in titanium combined with nitrogen and carbon, respectively, impart a much greater wear-resistance in cutting tools than a uniform coating composition of either alone. While the cause for this is not completely understood, this phenomenon is probably due to the fact that each of the layers react differently to the different types of wear. As previously mentioned, the clearance face wear in cutting tools is predominantly due to abrasion, while the cratering wear is primarily due to diffusion. If part of a tool coated according to this invention is subjected to one of such types of wear, it is though that if the uppermost layer contains a composition with little resistance of this type of wear, it will be rapidly abraded and thus expose the next layer having a different composition which is more likely to be highly resistant to this type of wear. Moreover, the combination of the different layers provides surprising and improved results as mentioned hereinafter.

An important advantage of the combination of layers of the new coatings is that they have a less pronounced epitaxial structure and a finer grain structure, and this reduces possibility of cracking and chipping of the layers.

Additional advantages are found when the new coated tool elements are subjectd to interrupted cuts, particularly in milling, for they display greater resistance to cyclical temperature changes and to impact effects.

The structure of the coating layers of the present invention is not only of significance for cutting tools, but is equally advantageous for tools used for non-chipping, shaping operations, e.g., for drawing, swaging, or forging.

When drawing thick steel wire using drawing dies coated with titanium carbide alone it has been found that the titanium carbide is highly resistant to the large tensile forces exerted on the surface of the drawing die bore; however, galling of the wire was observed relatively early. The formation of undesirable grooves in the wire was found to be due to peeling of the titanium carbide coating.

When drawing dies were equipped with the combined titanium carbide-titanium coating of this invention, there appeared to be a substantial reduction in the coefficient of friction, for the drawing force was rendered; consequently the service life was increased compared with the comparable drawing dies having only a pure titanium carbide coating. This reduction of the drawing force also makes it possible to effect larger reductions in a single pass.

The following examples illustrate the practice of the invention.

EXAMPLE I

Cemented carbide plates (84% tungsten carbide, 10% titanium and tantalum carbides with 6% cobalt as a binder metal) or drawing dies (tungsten carbide containing 6% cobalt as a binder metal) which are to be coated are first cleaned and then carburized in order to enrich the surface with carbon. The cemented carbide parts are then annealed at 850° to 1200° C. in a gas mixture consisting of 92.3 volume % of hydrogen, 0.4% titanium tetrachloride, 7% methane and 0.3% nitrogen. The gas mixture reacts at the surface of the cmented carbide part and forms an initial titanium carbonitride deposit with a high carbon content. After 5 to 20 minutes, the flow of methane is slowly reduced and that of the nitrogen increased over a period of 10 to 40 minutes. After this operation, the parts are coated for 20 to 60 minutes in a gas mixture consisting of 0.5% titanium tetrachloride, 69.5% hydrogen and 30% nitrogen, which yields a final layer of pure titanium nitride.

Metallographic examination of the coatings showed that, depending upon the process parameters (temperature, time and gas composition), the coatings comprise a 0.5 to 3 microns thick initial layer of titanium carbonitride of high carbon content (80% titanium, 18% carbon and 2% nitrogen) in contact with the carburized cemented carbide substrate, and the composition of the deposited material changes gradually to provide a 3 to 20 microns thick surface layer of titanium nitride. Since titanium carbide and titanium nitride are miscible in any proportions, sharp boundaries between the individual layers in the coating cannot be observed.

EXAMPLE II

Cemented carbide tips (71% tungsten carbide, 20% titanium and tantalum carbides with 9% cobalt) or drawing dies (tungsten carbide containing 9% cobalt binder) to be coated are first cleaned and may be subsequently carburized in order to enrich the surface with carbon. The parts are then annealed at 850° to 1200° C. in a gas mixture consisting of 0.4 volume % of titanium tetrachloride, 10% methane, 0.2% nitrogen and the remainder of hydrogen. The gas mixture reacts at the surface of the cemented carbide parts resulting in the deposition of a titanium carbonitride of high carbon content. After 5 to 20 minutes, the proportion of methane is slowly reduced, while that of nitrogen is increased during a transition deposition period of 30 to 60 minutes. The parts are further coated in a gas mixture consisting of 0.4% by volume of titanium tetrachloride, 1.2% methane, 74% hydrogen and 25% nitrogen. with the nitrogen content now higher than the methane content, for another 20 to 60 minutes, with the result, that a titanium carbonitride layer of high nitrogen content is now deposited. Atmospheric pressure is employed in all of the foregoing treatments and in all other detailed examples herein.

Metallographic examination of the coatings showed that, depending on the process conditions, each includes a 0.5 to 3microns thick, high carbon titanium carbonitride initial layer (80% Ti, 19% C and 1% N), and the composition changes continuously with the content of combined carbon decreasing and nitrogen increasing until a 3 to 20 microns thick final or surface layer of titanium carbonitride with a high nitrogen content (77.5% Ti, 21.5% N and 1% C.) is reached.

The disposable inserts coated in accordance with Examples I and II were subjected to machining tests under different cutting conditions and showed an increase in service life of approximately 10-30% compared with inserts coated with pure titanium nitride only. Because of the approximate 25 to 50% reduction is clearance face wear compared with the titanium nitride coated inserts, superior surface quality was displayed by the workpiece produced by the inserts of the present invention.

In thick wire drawing with steel wire (e.g., C60) at high drawing speeds, it was found that the drawing dies equipped with the combined coating of titanium carbide-titanium nitride has approximately 2.5 to 3 times longer service lives than uncoated dies whereas the drawing dies coated with titanium carbide only had approximately twice the service life of the uncoated dies.

EXAMPLE III

Clean cemented tunsten carbide cutting inserts or drawing dies with a 6% content of cobalt are heated in an oven at approximately 850° to 1200° C. in a gas mixture consisting of 0.6 volume % of titanium tetrachloride, 0.6% benzene, 60% argon and 39% hydrogen.

The gas mixture reacts at the surface of the cemented carbide parts and titanium carbide is deposited. After 5 to 20 minutes, the supply of benzene and argon is discontinued, the charging of nitrogen is started and the proportions of hydrogen is increased. All of the these adjustments are effected quickly so that no significant transition period occurs. The coating is continued with the gas mixture, which now consists of 0.5% titanium tetrachloride, 69.5% hydrogen and 30% nitrogen, for another 20 to 60 minutes, with pure titanium nitride being deposited as the surface layer.

Metallographic study of the coating revealed that depending on the operating parameters, it is made up of a 0.5 to 2 micros thick initial titanium carbide layer contiguous with a 3 to 20 microns thick final layer of titanium nitride.

When subjected to machining tests and depending on the cutting conditions, disposable inserts equipped with this coating display an increase in service life of approximately 10-20% compared with disposable inserts coated with pure titanium nitride only.

EXAMPLE IV

Clean cemented carbide inserts (77% tungsten carbide, 10% titanium and tantalum carbides, with 13% cobalt) or tungsten carbide drawing dies of 12% cobalt content are heated in a furnace at approximately 850° to 1200° C. in a gas mixture consisting of titanium tetrachloride, benzene, argon and some hydrogen. The gas mixture reacts at the surface of the cemented carbide parts and titanium carbide is deposited. After approximately 5 to 15 minutes, the supply of benzene and argon is slowly diminished, nitrogen is introduced and the proportions of hydrogen and nitrogen are slowly increased during an interval of 10 to 30 minutes until benzene is no longer present. After 20 to 60 minutes. the proportion of nitrogen is slowly reduced and the charging of benzene and argon resumed in 10 to 30 minutes; finally coating is continued for another 1 to 10 minutes in a mixture now containing only titanium tetrachloride, hydrogen, argon and benzene. The steady gas mixtures are the same as in Example 3.

Metallographic examination of the coating showed that depending on the chosen conditions, the coating comprises a 0.5 to 3 microns thick titanium carbide initial layer in direct contact with the cemented carbide element, then the composition changes gradually and continuously with combined carbon decreasing and nitrogen increasing until a 3 to 20 micron thick layer of titanium nitride is reached; and overlying this are further layers of gradually decreasing combined nitrogen and increasing carbon content, and finally an approximate 0.1 to 0.5 micron thick layer of titanium carbide at the external surface.

Disposable inserts equipped with these coatings gave an improved service life in milling applications of approximately 10-30% compared with inserts coated with pure titanium nitride or pure titanium carbide. Futhermore, the surface quality of the milled parts was superior to that of inserts coated with titanium nitride or carbide, because the inserts with the combined coating have less tendency to splintering of the cutting edges.

This invention is not restricted to the above-described embodiments which are intended for purposes of illustration. It may be used to advantage not only in all types of tools for machining and for drawing dies but also for other tools used in chipless forming. In principle, it is possible by means of the invention to increase the wear resistance of all parts which are subject to mechanical wear. Accordingly, the present invention should not be construed as limited in any particulars except as may be stated in the appended claims or required by the prior art.

I claim:

1. A method of producing an article of manufacture comprising a hard metal or cemented carbide substrate and an adherent wear-resistant coating, the compositions of said coating varying through its depth and thickness, from essentially pure titanium carbide closest to the substrate to essentially pure titanium nitride furthest from the substrate, comprising the steps of:
    (a) reacting the surface of said substrate with a gaseous mixture comprising a titanium halide, a hydrocarbon gas, and hydrogen to form a titanium carbide layer adjacent the surface of said substrate; and
    (b) reacting the surface of the titanium carbide layer with a gaseous mixture comprising a titanium halide, a nitrogen-containing gas, and hydrogen to form a layer comprising titanium nitride overlying the titanium carbide layer.

2. A method of producing an article of manufacture comprising a hard metal or cemented carbide substrate and an adherent wear-resistant coating, the composition of said coating varying through its depth and thickness, from essentially pure titanium carbide closest to the substrate through an intermediate titanium carbonitride zone to essentially pure titanium nitride furthest from the substrate, comprising the steps of:
    (a) reacting the surface of said substrate with a gaseous mixture consisting essentially of a titanium halide, a hydrocarbon gas, and hydrogen to form a titanium carbide coating layer adjacent to the surface of said substrate;
    (b) reacting the surface of the titanium carbide layer with a gaseous mixture consisting essentially of a titanium halide, a hydrocarbon gas, a nitrogen-containing gas, and hydrogen to form a titanium carbonitride coating layer overlying the titanium carbide layer; and
    (c) reacting the surface of the titanium carbonitride layer with a gaseous mixture consisting essentially of a titanium halide, a nitrogen-containing gas, and hydrogen to form a titanium nitride coating layer overlying the titanium carbonitride layer.

3. A method of producing an article of manufacture comprising a cemented carbide substrate bearing an adherent wear-resistant coating, the composition of said coating varying through its depth and thickness from titanium carbide rich, titanium nitride poor closest to the substrate to titanium nitride rich, titanium carbide poor furthest from the substrate, said method comprising depositing titanium compounds from gaseous mixtures comprising a gaseous titanium compound, a hydrocarbon gas and a nitrogen-containing gas, regulating the quantities of hydrocarbon gas and nitrogen-containing gas present in the mixture at any given time to provide first a hydrocarbon gas rich, nitrogen gas poor mixture and finally a hydrocarbon gas poor, nitrogen gas rich mixture, to thereby deposit from the vapor phase an essentially pure titanium carbide coating layer closest to said substrate, an intermediate coating layer of titanium carbonitrides and an essentially pure coating layer of titanium nitride furthest from said substrate.

4. A method according to claim 3 at least one layer of a coating material of the group consisting of a titanium carbide and a titanium carbonitride is deposited from a carbon-rich gaseous mixture subatmospheric pressure, and at least one layer of a coating material of the group consisting of a titanium nitride and a titanium carbonitride is deposited under superatmospheric pressure from a nitrogen-rich gaseous mixture of not more than low carbon content.

5. A method according to claim 3 in which said gaseous mixtures contain in inert gas or hydrogen or mixtures thereof.

6. A method according to claim 3 in which the surface of said cemented substrate is carburized prior to the deposition of said coating material.

7. The method of claim 1 wherein the surface of said substrate is first carburized to dispose carbon in a region adjacent to the surface of said substrate.

8. The method of claim 2 wherein the surface of said substrate is first carburized to dispose carbon in a region adjacent to the surface of said substrate.

9. A method as in claim 1 wherein the article of manufacture is in the form of a coating insert for a tool.

10. A method as in claim 9 wherein the substrate is a cemented carbide.

11. A method as in any of claims 1, 2, 3 and 10 in which the nitrogen-containing gas is nitrogen.

12. A method as in claim 2 wherein the article of manufacture is in the form of a coating insert for a tool.

13. A method as in claim 11 wherein the adherent wear-resistant coating is applied so as to form the wear surface of a tool.

14. A method as in claim 2 wherein the adherent wear-resistant coating is applied so as to form the wear surface of a tool.

15. A method as in claim 2 wherein the adherent wear-resistant coating is applied so as to form the wear surface of a die.

16. A method for applying a coating to a cemented carbide substrate, said substrate being in the shape of an insert for use as the cutting edge of a tool, consisting essentially of heating the substrate while it is exposed to a first vapor phase consisting essentially of a titanium compound and a hydrocarbon, for a period and at a temperature sufficient to deposit from said vapor phase a coating layer of titanium carbide, and thereafter, substituting a nitrogen-containing gas for said hydrocarbon to form a second vapor phase, and exposing the substrate to the resulting second vapor phase for a period and at a temperature sufficient to deposit therefrom a coating layer of titanium nitride over said titanium carbide coating layer, the combination of the coatings resulting in a composite insert exhibiting enhanced resistance to both crater wear and clearance face wear.

17. A method as in claim 16 wherein the titanium compound is titanium tetrachloride, the hydrocarbon is methane, and the nitrogen-containing gas is nitrogen.

18. A method as in claim 17, wherein each vapor phase also contains hydrogen and argon.

19. A method as in claim 16 wherein the titanium compound is titanium tetrachloride.

20. A method as in claim 16 wherein, after deposition of the coating layer of titanium carbide over the substrate, the composition of the first vapor phase is changed to form an intermediate vapor phase by addition of a nitrogen-containing gas thereto, for a period and at a temperature sufficient to deposit titanium carbonitride coating over said titanium carbide coating, and thereafter removing the said hydrocarbon to form the second vapor phase, which then deposits the titanium nitride coating over the titanium carbonitride coating.

21. A method as in claim 20 wherein the titanium compound is titanium tetrachloride, the hydrocarbon is methane, and the nitrogen-containing gas is nitrogen.

22. A method as in claim 21 wherein each vapor phase also contains hydrogen and argon.

23. A method as in claim 20 or 21 wherein, after deposition of the titanium carbide coating layer, and before deposition of the titanium nitride coating layer, the proportions of hydrocarbon and of nitrogen-containing gas contained in the intermediate vapor phase are gradually adjusted from hydrocarbon rich to nitrogen rich so as to deposit a titanium carbonitride coating layer that varies in composition from carbon rich adjacent to the titanium carbide coating layer to nitrogen rich adjacent to the titanium nitride coating layer.

24. A method as in claim 17 or 21 in which the first vapor phase is maintained at a subatmospheric pressure during deposition of the titanium carbide coating layer.

* * * * *

UNITED STATES PATENT AND TRADEMARK OFFICE
CERTIFICATE OF CORRECTION

PATENT NO. : 4,162,338
DATED : August 9, 1979
INVENTOR(S) : Wilfried Schintlmeister It is certified that error appears in the above-identified patent and that said Letters Patent are hereby corrected as shown below:

In Column 10, line 21 and in Column 10, line 27,

"coating" should be changed to --cutting--

Signed and Sealed this

Fifth Day of February 1980

[SEAL]

Attest:

Attesting Officer

SIDNEY A. DIAMOND
Commissioner of Patents and Trademarks

REEXAMINATION CERTIFICATE (1020th)
United States Patent [19]
Schintlmeister

[11] B1 4,162,338

[45] Certificate Issued Mar. 7, 1989

[54] COATED CEMENTED CARBIDE ELEMENTS AND THEIR MANUFACTURE

[75] Inventor: Wilfried Schintlmeister, Reutte, Austria

[73] Assignee: Schwarzkopf Development Corp., New York, N.Y.

Reexamination Request:
No. 90/001,338, Sep. 23, 1987

Reexamination Certificate for:
Patent No.: 4,162,338
Issued: Jul. 24, 1979
Appl. No.: 875,071
Filed: Feb. 3, 1978

Related U.S. Application Data

[60] Division of Ser. No. 571,695, Apr. 25, 1975, Pat. No. 4,101,703, which is a continuation of Ser. No. 329,128, Feb. 2, 1973, abandoned.

[30] Foreign Application Priority Data

Feb. 4, 1972 [AT] Austria .................. 896/72
Jul. 21, 1972 [AT] Austria .................. 6317/72

[51] Int. Cl.⁴ .......................... B05D 1/36; B05D 3/10; B05D 7/14; C23C 16/32
[52] U.S. Cl. ........................ 427/249; 148/63; 427/255; 427/255.1; 427/255.2; 427/255.4; 427/255.7

[56] References Cited

U.S. PATENT DOCUMENTS

| | | | |
|---|---|---|---|
| 1,098,794 | 6/1914 | Fleming . | |
| 1,895,959 | 1/1933 | Agte . | |
| 2,077,239 | 4/1937 | Hinnuber | 75/136 |
| 2,872,350 | 2/1959 | Homer | 117/106 |
| 2,962,388 | 11/1960 | Ruppert et al. | 117/49 |
| 2,962,399 | 11/1960 | Ruppert | 145/6.35 |
| 2,972,556 | 2/1961 | Vrahiotes | 117/106 |
| 3,073,717 | 1/1963 | Pyle | 117/69 |
| 3,120,453 | 2/1964 | Fitzer | 117/217 |
| 3,178,308 | 4/1965 | Oxley | 117/106 |
| 3,340,076 | 9/1967 | Alper | 106/56 |
| 3,549,337 | 12/1970 | Palmer | 29/183.5 |
| 3,640,689 | 2/1972 | Glaski | 29/195 |
| 3,656,995 | 4/1972 | Reedy | 117/69 |
| 3,717,496 | 2/1973 | Kieffer et al. | 117/49 |
| 3,772,058 | 11/1973 | Bloom | 117/62 |
| 3,959,557 | 5/1976 | Berry | 428/368 |
| 4,411,566 | 10/1983 | Lee | 407/119 |

FOREIGN PATENT DOCUMENTS

| | | |
|---|---|---|
| 1056449 | 4/1959 | Fed. Rep. of Germany . |
| 1247671 | 8/1967 | Fed. Rep. of Germany . |
| 1954366 | 6/1971 | Fed. Rep. of Germany . |
| 762931 | 12/1956 | United Kingdom . |
| 1284030 | 8/1972 | United Kingdom . |

OTHER PUBLICATIONS

Powell, et al., Vapor Deposition, John Wiley and Sons, New York 1966.

Schwarzkopf, P. and Kieffer, R., Refractory Hard Metals-Borides, Carbides, Nitrides, and Silicides, MacMillan Co., New York 1953.

Kieffer, R. et al., "About Nitrides and Carbonitrides on Nitride-Based Cemented Hard Alloys", P/M Refractory Materials and Speciality Products, Technical University, Vienna, Austria (1971).

Zelikeman, A. and Gorvaites, N., "A Study of the Reaction of Nitrogen with Titanium Carbide", J. Applied Chem. U.S.S.R. 23,727-33 (1950).

Von Benda, K., et al., "Electrochemical Behavior of Tungsten Carbide Elements", Electrocatalysis Fuel Cell, 2972.

"Longer Life from Tin Tools", Manufacturing Engineering & Management, Jul. 1971.

Wyatt, J. and Grant, N., "Nitriding Improves Titanium Properties", The Iron Age, Jan. 28, 1954.

Binder, et al., "Tungsten Carbide Electrodes for Fuel Cells with an Acid Electrolyte", Nature 224 (5226), pp. 1299-1300, 1969.

Ruppert, "Interlayers Between CVD Coatings & Base Materials", The Third International Conference on Chemical Vapor Depositions, Apr. 24-27, 1972.

Weser, A., et al., "Investigation of Borides, Carbides, and Nitrides on their Suitability as Measuring Electrodes in Ferro-Ferricyanide Systems", Proc. IMEKO (Int. Meas. Confed.)-Symp. Electrochem. Sens. 1968, 99-109.

Powell, C. F. et al., Vapor-Plating: The Formation of Coatings by Vapor-Deposition Techniques, John Wiley & Sons, New York, 1955.

The Encyclopedia of Engineering Materials and Processes, Reihold Publishing Co., 1963.

Modern Machine, Jul. 1971.

*Primary Examiner*—Sandie L. Childs

[57] ABSTRACT

Cemented carbide elements with working faces bearing a thin multilayer or stratified coating of nonuniform composition of wear-resistant materials exhibit superior wear-resistance for improved performance and service life under severe service conditions as in the case of inserts for cutting tools and wire drawing dies. In one embodiment, an initial carbon-rich layer of titanium carbide or carbonitride coating material in direct contact with a cemented carbide part or insert underlies a middle or intermediate stratified transition zone made up of a series of parallel layers or strata of coating material wherein the content of carbon and nitrogen is not constant but varies with the stratum or location by depth in that zone with the material gradually changing to titanium compounds that are progressively lower in combined carbon content and richer in nitrogen than in the initial layer until the composition of the outermost stratum of the transition zone approximates that of the overlying surface layer of high nitrogen content (e.g., titanium nitride). The coating is formed by a gas deposition method wherein changes in the concentration of gaseous carbon and nitrogen compounds are used to control the formation of the various layers of different composition in the layered coating.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–6, 8, 14–24 is confirmed.

Claims 7, 9, 11 and 12 are determined to be patentable as amended.

Claims 10 and 13, dependent on an amended claim, are determined to be patentable.

New claims 25 and 26 are added and determined to be patentable.

7. The method of [claim 1] *claim 26* wherein the surface of said substrate is first carburized to dispose carbon in a region adjacent to the surface of said substrate.

9. A method as in [claim 1] *claim 26* wherein the article of manufacture is in the form of a [coating] *coated* insert for a tool.

11. A method as in any of claims [1, 2, 3 and 10] *3, 10, 25 and 26* in which the nitrogen-containing gas is nitrogen.

12. A method as in claim 2 wherein the article of manufacture is in the form of a [coating] *coated* insert for a tool.

*25. A method as in claim 2 wherein the substrate is comprised of a cemented carbide.*

*26. A method as in claim 1 wherein the substrate is comprised of a cemented carbide.*

* * * * *